Sept. 23, 1969 P. A. E. GARDNER 3,469,178
VOLTAGE LEVEL SHIFT CIRCUIT CONTROLLED BY RESISTOR RATICS
Filed May 4, 1966
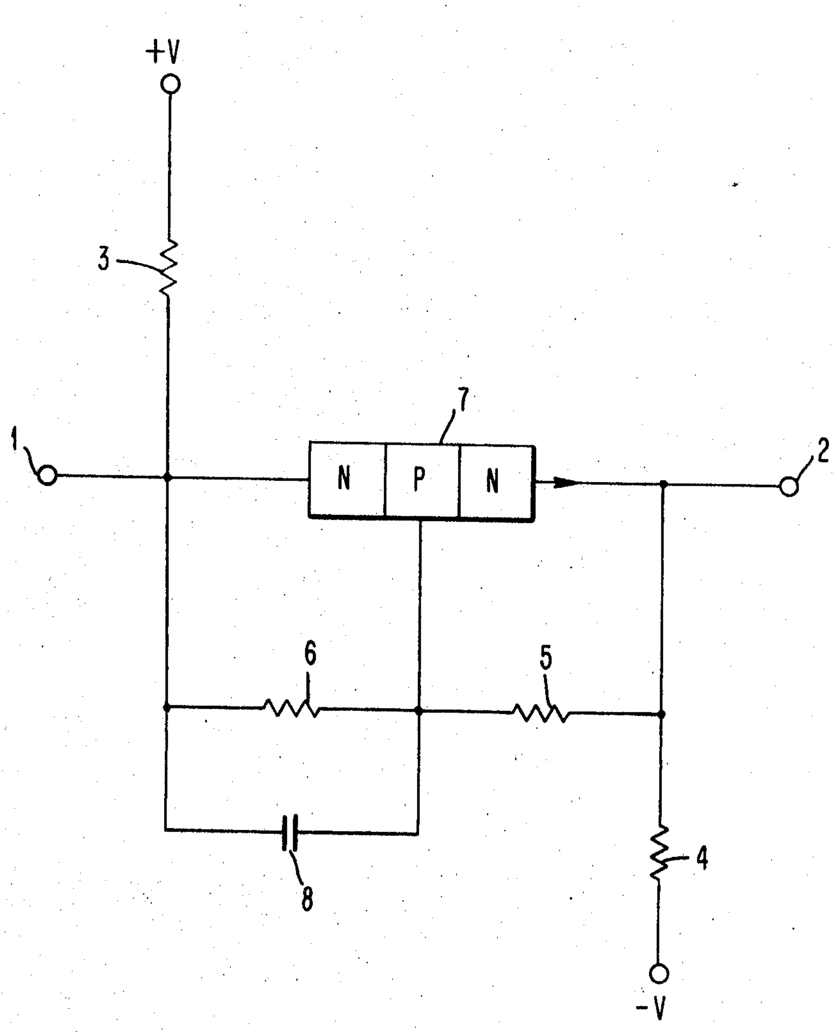
INVENTOR
PETER ALAN EDWARD GARDNER
BY W. S. Robertson
ATTORNEY

United States Patent Office 3,469,178

Patented Sept. 23, 1969

3,469,178

VOLTAGE LEVEL SHIFT CIRCUIT CONTROLLED BY RESISTOR RATIOS

Peter Alan Edward Gardner, Winchester, England, assignor to International Business Machines Corporation, Armonk, N.Y., a corporation of New York Filed May 4, 1966, Ser. No. 549,427
Claims priority, application Great Britain, June 24, 1965, 26,711/65
Int. Cl. H02p *13/14;* H02m *3/08;* G05f *1/60*
U.S. Cl. 323—22 6 Claims

ABSTRACT OF THE DISCLOSURE

A level shift circuit connected between the output of a preceding stage and the input to the next stage comprises a transistor having its collector terminal connected to the output and its emitter terminal connected to the input and two resistors connected between the base and collector terminals and the base and emitter terminals of the transistor. The voltage level shift is proportional to the ratio of the resistors and the circuit can be adjusted by trimming the resistors.

In many circuits it is desirable to vary the voltage at the output of one stage about an absolute voltage level that differs from the voltage level at the input of the next stage. For example, it is well known to use a capacitor or a transformer to couple a relatively high direct voltage plate circuit of one stage to a relatively low direct voltage grid terminal of the next stage. In direct coupled circuits it is well known to couple two stages by means of a two terminal device that maintains a substantially fixed voltage across these terminals. A circuit having this function is called a level shifter. A typical level shifter is a zener diode that is reverse biased to conduct with the voltage across its terminals substantially invariant and independent of the current level. An object of this invention is to provide a new and improved level shifter.

A more specific object of this invention is to provide a voltage level shifter that can be adjusted easily. More specifically, an object of this invention is to provide a new improved level shifting circuit of the type that uses a semiconductor device in which the voltage level shift can be adjusted independently of the characteristics of the semiconductor device itself. With this feature, semiconductor devices having differing characteristics can be adjusted to give the same level shift characteristics; similarly a particular semiconductor device can be adapted to produce any selected voltage level shift within a fairly wide range.

SUMMARY OF THE INVENTION

The circuit of this invention comprises a transistor that has its collector terminal connected to the output terminal of a preceding stage and its emitter terminal connected to the input terminal of the next stage. Two resistors are connected in series across the emitter and collector terminals of the transistor and the midpoint of the resistor combination is connected to the base terminal of the transistor. As will be explained in detail later, this circuit produces a voltage across the emitter and collector terminals that is substantially invariant and independent of the current through the circuit. In addition, this voltage is a function of the ratios of the resistors and a particular voltage level shift can be provided by suitably adjusting the resistors.

The foregoing and other objects, features and advantages of the invention will be apparent from the following more particular description of a preferred embodiment of the invention, as illustrated in the accompanying drawing.

The drawing shows one embodiment of the level shifter of this invention and illustrative components from the preceding stage and the next stage.

THE CIRCUIT OF THE DRAWING

The circuit is for use in direct coupled circuits and provides a voltage reference level shift between signals applied to a terminal 1 of a preceding stage and signals at a terminal 2 of the next stage. A resistor 3 is connected between terminal 1 and a source of positive (arbitrarily) voltage. Resistor 3 illustrates a conductive path in the preceding stage that may be formed by active or passive components; resistor 3 can also be considered to be connected in the circuit of the level shifter to bias the components that have not yet been described. The circuit also includes a resistor 4 that connects the terminal 2 to a suitable point of potential. As has been described for resistor 3, resistor 4 illustrates a conductive path in the next stage or a discreet resistor in the level shift circuit.

The level shifter comprises a transistor 7 having its collector terminal connected to terminal 1 and its emitter terminal connected to terminal 2. The level shifter also includes a potentiometer network comprising series connected resistors 5 and 6 that are connected across the emitter and collector terminals of the transistor. The junction of resistors 5 and 6 is connected to the base terminal of the transistor.

The potentiometer network illustrated by resistors 5 and 6 can comprise two discreet resistors or a potentiometer having a movable wiper connected to the base terminal or, preferably, resistors of the type that can be adjusted by removing part of their material to reduce the cross sectional area of conduction.

It will simplify the explanation of the operation of the circuit to first assume that the resistance between the base terminal and emitter terminal of the transistor is much larger than the resistance of resistor 5 so that the current in resistor 6 is closely equal to the current in resistor 5. With this simplification, the voltage drop between the input and output terminals (that is, the voltage drop across the series combination of resistors 5 and 6) can be written as a function of the base to emitter voltage of the transistor, $V_{BE}$, and the values of resistors 5 and 6. Since the current in resistor 5 equals $V_{BE}/R_5$ the voltage across resistor 6 equals $V_{BE}R_6/R_5$.

Therefore the voltage across the combination of resistors 5 and 6 equals $$\frac{V_{BE}(R_6+R_5)}{R_5}$$

Considered from another standpoint, any voltage increase across terminals 1 and 2 leads to an increase in the base current of the transistor which in turn tends to increase the current that the transistor conducts for any particular value of voltage across its emitter and collector terminals. If the resistance of the base-emitter circuit is not negligible, the resistance of the parallel combination of resistor 5 and the base to emitter resistance can be substituted in the formula for resistance 5. Conversely when resistance $R_5$ is much greater than the resistance of the base-emitter junction, the circuit effectively operates without resistor 5. In this case it is more difficult to trim the resistors to achieve the desired voltage level shift. Preferably the circuit component values are chosen so that the circuit operates according to the simplified equation that has been presented already.

As the circuit has been described so far, any changes across terminals 1 and 2 appear in a substantially predetermined ratio across resistors 5 and 6 (except for variations in the resistance of the base-emitter junction of the transistor). The circuit can be made somewhat faster by connecting a capacitor 8 across resistor 6. With this feature, voltage changes across the circuit initially appear only across the base-emitter junction and thereby speed up the circuit response to changes in the voltage at either terminal.

While the invention has been particularly shown and described with reference to preferred embodiment thereof, it will be understood by those skilled in the art that the foregoing and other changes in form and details may be made therein without departing from the spirit and scope of the invention.

What is claimed is:

1. A level shifting circuit for introducing a substantially fixed voltage between an output signal terminal of a preceding stage and an input signal terminal of a next stage, comprising, a transistor having its collector terminal connected to said output signal terminal and its emitter terminal connected to said input signal terminal, and means responsive to the voltage developed at one of said signal terminals to provide a signal to the transistor to maintain a constant voltage between said signal terminals.

2. Circuit according to claim 1 in which said means responsive to the voltage developed at one of said signal terminals comprises a resistor connecting the base terminal of said transistor to said output signal terminal.

3. A circuit according to claim 2 in which said means responsive to the voltage developed at one of said signal terminals further includes a second resistor connecting said base terminal to said input signal terminal.

4. A circuit according to claim 3 having component values to maintain across said input and output signal terminals a voltage that is a function of the base to emitter voltage of said transistor and the ratio of the resistances of said two resistors.

5. A circuit according to claim 4 in which said resistors are adapted to be adjusted for giving the circuit a selected voltage level shift.

6. A circuit according to claim 5 further including a capacitor connected between said base and collector terminals of said transistor to enhance the circuit operation.

References Cited

UNITED STATES PATENTS

| | | | |
|---|---|---|---|
| 3,174,095 | 3/1965 | Cocker ---------- | 307—296 XR |
| 3,241,045 | 3/1966 | Brousseau et al. -- | 307—297 XR |
| 3,283,180 | 11/1966 | Pressman -------- | 307—218 XR |

JOHN S. HEYMAN, Primary Examiner

JOHN ZAZWORSKY, Assistant Examiner

U.S. Cl. X.R.

307—237, 297; 323—39